US009218769B2

(12) United States Patent
Athas

(10) Patent No.: US 9,218,769 B2
(45) Date of Patent: Dec. 22, 2015

(54) ANTI-PHASE PULSE WIDTH MODULATOR

(75) Inventor: William C. Athas, San Jose, CA (US)

(73) Assignee: APPLE INC., Cupertino, CA (US)

( * ) Notice: Subject to any disclaimer, the term of this patent is extended or adjusted under 35 U.S.C. 154(b) by 2377 days.

(21) Appl. No.: 12/052,469

(22) Filed: Mar. 20, 2008

(65) Prior Publication Data

US 2009/0237415 A1 Sep. 24, 2009

(51) Int. Cl.

| | |
|---|---|
| ***G06F 3/038*** | (2013.01) |
| ***G09G 5/00*** | (2006.01) |
| ***G09G 5/10*** | (2006.01) |
| ***G09G 3/10*** | (2006.01) |
| ***G02F 1/1335*** | (2006.01) |
| ***A47F 3/00*** | (2006.01) |
| ***F21V 7/04*** | (2006.01) |
| ***H03H 9/00*** | (2006.01) |
| ***G09G 3/34*** | (2006.01) |
| ***G09G 3/30*** | (2006.01) |
| ***G09G 3/32*** | (2006.01) |
| ***G09G 3/36*** | (2006.01) |

(52) U.S. Cl.

CPC ........ *G09G 3/3406* (2013.01); *G09G 2320/064* (2013.01)

(58) Field of Classification Search

CPC .................................................... G09G 3/3406
USPC ........... 345/76–77, 79, 82–83, 102, 207, 209, 345/214, 690–691; 315/169.3; 349/69–71; 362/561

See application file for complete search history.

(56) References Cited

U.S. PATENT DOCUMENTS

| | | | | |
|---|---|---|---|---|
| 5,184,117 | A * | 2/1993 | Gauthier | 345/102 |
| 6,841,947 | B2 * | 1/2005 | Berg-johansen | 315/169.3 |
| 7,233,309 | B2 * | 6/2007 | Diefenbaugh et al. | 345/102 |
| 7,292,221 | B2 * | 11/2007 | Woo | 345/102 |
| 7,348,960 | B2 * | 3/2008 | Huang et al. | 345/102 |
| 7,481,566 | B2 * | 1/2009 | Han | 362/621 |
| 8,248,439 | B2 * | 8/2012 | Ran et al. | 345/690 |
| 2007/0075790 | A1 * | 4/2007 | Liao | 331/36 C |
| 2007/0171353 | A1 | 7/2007 | Hong | |
| 2007/0195221 | A1 | 8/2007 | Won et al. | |
| 2007/0223248 | A1 | 9/2007 | Han | |
| 2007/0268236 | A1 | 11/2007 | Morrow | |
| 2008/0049006 | A1 * | 2/2008 | Yi et al. | 345/211 |
| 2008/0055289 | A1 * | 3/2008 | Kim et al. | 345/204 |
| 2008/0074568 | A1 * | 3/2008 | Tanaka et al. | 349/37 |
| 2008/0129663 | A1 * | 6/2008 | Honda | 345/84 |
| 2008/0136355 | A1 * | 6/2008 | Han et al. | 315/307 |
| 2009/0015538 | A1 * | 1/2009 | Rumreich | 345/102 |
| 2009/0147606 | A1 * | 6/2009 | Daniel | 365/222 |

* cited by examiner

*Primary Examiner* — Joseph Feild
*Assistant Examiner* — Karin Kiyabu
(74) *Attorney, Agent, or Firm* — Fletcher Yoder PC

(57) ABSTRACT

A method and system is disclosed for modifying the pulse width modulation signal frequency for controlling the back-light illumination intensity of a liquid crystal display. The modified pulse width modulation signal frequency is selected to eliminate visible light and dark bands in the liquid crystal display image. The brightness of the display may be also adjusted by modifying the duty cycle of the pulse width modulation signal. The brightness selected, either automatically or by the user, is matched with a pulse width modulation signal frequency to insure that the pulse width modulation signal will be anti-phased across a plurality of contiguous frame refresh periods.

19 Claims, 4 Drawing Sheets

ANTI-PHASE PULSE WIDTH MODULATOR

BACKGROUND

1. Technical Field

The present invention relates generally to controlling the backlight illumination source of a liquid crystal display.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Electronic devices increasingly include display screens as part of the user interface of the device. As may be appreciated, display screens may be employed in a wide array of devices, including desktop computer systems, notebook computers, and handheld computing devices, as well as various consumer products, such as cellular phones and portable media players. Liquid crystal display (LCD) panels have become increasingly popular for use in display screens. This popularity can be attributed to their light weight and thin profile, as well as the relatively low power it takes to operate the LCD pixels.

The LCD typically makes use of backlight illumination because the LCD does not emit light on its own. Backlight illumination typically involves supplying the LCD with light from a cathode fluorescent lamp or from light emitting diodes (LEDs). During use of an LCD, a user may want to adjust the brightness on the screen. However, varying the intensity of the backlight illumination source may prove difficult. For example, adjusting the current delivered to the LEDs may give the light emitted from the LEDs a yellowish tint. Therefore, there exists a need for controlling the brightness of a LCD display through techniques other than adjustment of the voltage or current delivered to the backlight illumination source.

SUMMARY

Certain aspects of embodiments disclosed herein by way of example are summarized below. It should be understood that these aspects are presented merely to provide the reader with a brief summary of certain forms an invention disclosed and/or claimed herein might take and that these aspects are not intended to limit the scope of any invention disclosed and/or claimed herein. Indeed, any invention disclosed and/or claimed herein may encompass a variety of aspects that may not be set forth below.

The present disclosure generally relates to techniques for controlling the backlight illumination intensity of a liquid crystal display. In accordance with one disclosed embodiment, a pulse-width modulator (PWM) may be used to toggle a backlight illumination source on and off. The frequency selected for this toggling may be chosen such that the PWM phase will be substantially anti-phased across contiguous frame refresh periods while synchronized to the refresh rate of the display. In this manner, all pixels will be exposed to an equal amount of backlight illumination as the pixels are refreshed during two or more full frame periods. In another embodiment, as the brightness of the LCD screen is adjusted, the PWM signal frequency is adjusted in response to the change in brightness to insure that the PWM signal frequency continues to be substantially anti-phased across a plurality of frame refreshes.

BRIEF DESCRIPTION OF THE DRAWINGS

These and other features, aspects, and advantages of the present invention will become better understood when the following detailed description of certain exemplary embodiments is read with reference to the accompanying drawings in which like characters represent like parts throughout the drawings, wherein.

DETAILED DESCRIPTION OF SPECIFIC EMBODIMENTS

One or more specific embodiments of the present invention will be described below. These described embodiments are only exemplary of the present invention. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The application is generally directed to controlling the backlight illumination intensity of a liquid crystal display through the use of a modified pulse width modulation signal. As the desired brightness of the liquid crystal display is changed, the pulse width modulation signal may be correspondingly modified to insure that the pulse width modulation signal frequency will be anti-phased across a plurality of contiguous frame refresh periods. In this manner, all pixels of the display will be exposed to an equal amount of backlight illumination over time.

Figure 1:
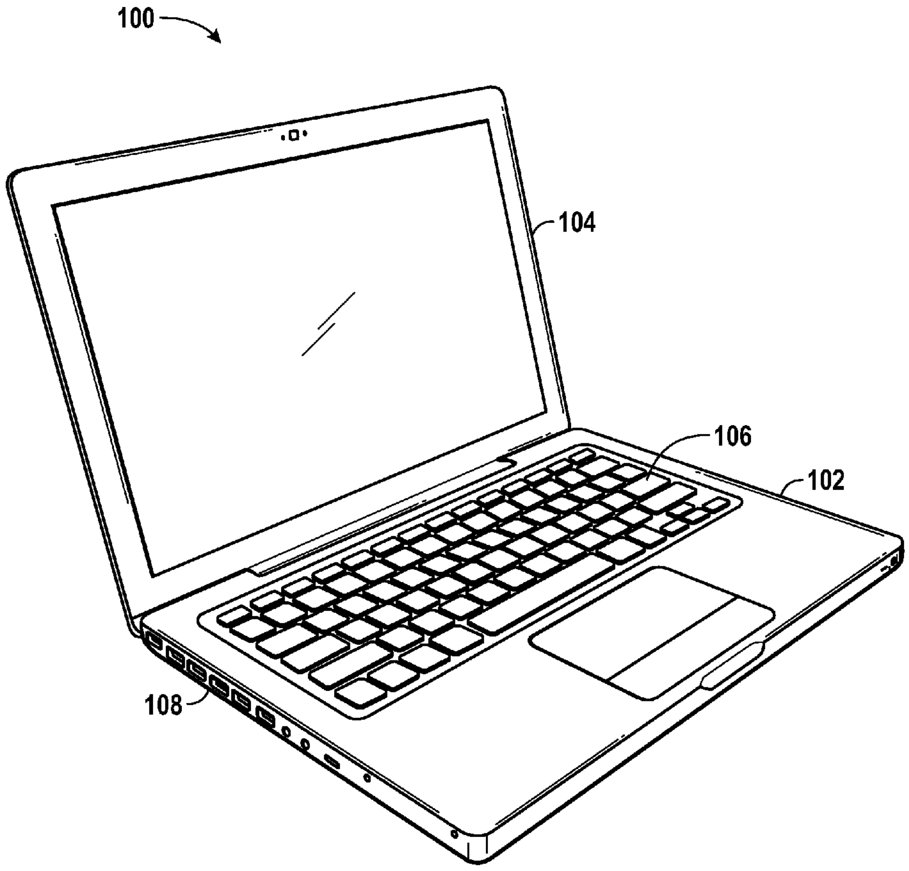
FIG. 1 is a perspective view illustrating an electronic device in accordance with one embodiment of the present invention.

An exemplary electronic device 100 is illustrated in FIG. 1 in accordance with one embodiment of the present invention. In some embodiments, including the presently illustrated embodiment, the device 100 may be a portable electronic device, such as a laptop computer. Other electronic devices may also include a viewable media player, a cellular phone, a personal data organizer, or the like. Indeed, in such embodiments, a portable electronic device may include a combination of the functionalities of such devices. In addition, the electronic device 100 may allow a user to connect to and communicate through the Internet or through other networks, such as local or wide area networks. For example, the portable electronic device 100 may allow a user to access the Internet and to communicate using e-mail, text messaging, or other forms of electronic communication. By way of example, the electronic device 100 may be a model of a MacBook or a MacBook Pro available from Apple Inc.

In certain embodiments, the electronic device 100 may be powered by one or more rechargeable and/or replaceable batteries. Such embodiments may be highly portable, allowing a user to carry the electronic device 100 while traveling, working, and so forth. While certain embodiments of the present invention are described with respect to a portable electronic device, it should be noted that the presently disclosed techniques may be applicable to a wide array of other electronic devices and systems that are configured to render graphical data, such as a desktop computer.

In the presently illustrated embodiment, the exemplary electronic device 100 includes an enclosure or housing 102, a display 104, input structures 106, and input/output connectors 108. The enclosure 102 may be formed from plastic, metal, composite materials, or other suitable materials, or any combination thereof. The enclosure 102 may protect the interior components of the electronic device 100 from physical damage, and may also shield the interior components from electromagnetic interference (EMI).

The display 104 may be a liquid crystal display (LCD). The LCD may be a light emitting diode (LED) based display or some other suitable display. In one embodiment, one or more of the input structures 106 are configured to control the device 100, such as by controlling a mode of operation, an output level, an output type, etc. For instance, the input structures 106 may include a button to turn the device 100 on or off. Further the input structures 106 may allow a user increase or decrease the brightness of the display 104. Embodiments of the portable electronic device 100 may include any number of input structures 106, including buttons, switches, a control pad, a keyboard, or any other suitable input structures. The input structures 106 may operate to control functions of the electronic device 100 and/or any interfaces or devices connected to or used by the electronic device 100. For example, the input structures 106 may allow a user to navigate a displayed user interface.

The exemplary device 100 may also include various input and output ports 108 to allow connection of additional devices. For example, the device 100 may include any number of input and/or output ports 108, such as headphone and headset jacks, universal serial bus (USB) ports, IEEE-1394 ports, Ethernet and modem ports, and AC and/or DC power connectors. Further, the electronic device 100 may use the input and output ports 108 to connect to and send or receive data with any other device, such as a modem, networked computers, printers, or the like. For example, in one embodiment, the electronic device 100 may connect to an iPod via a USB connection to send and receive data files, such as media files.

Figure 2:
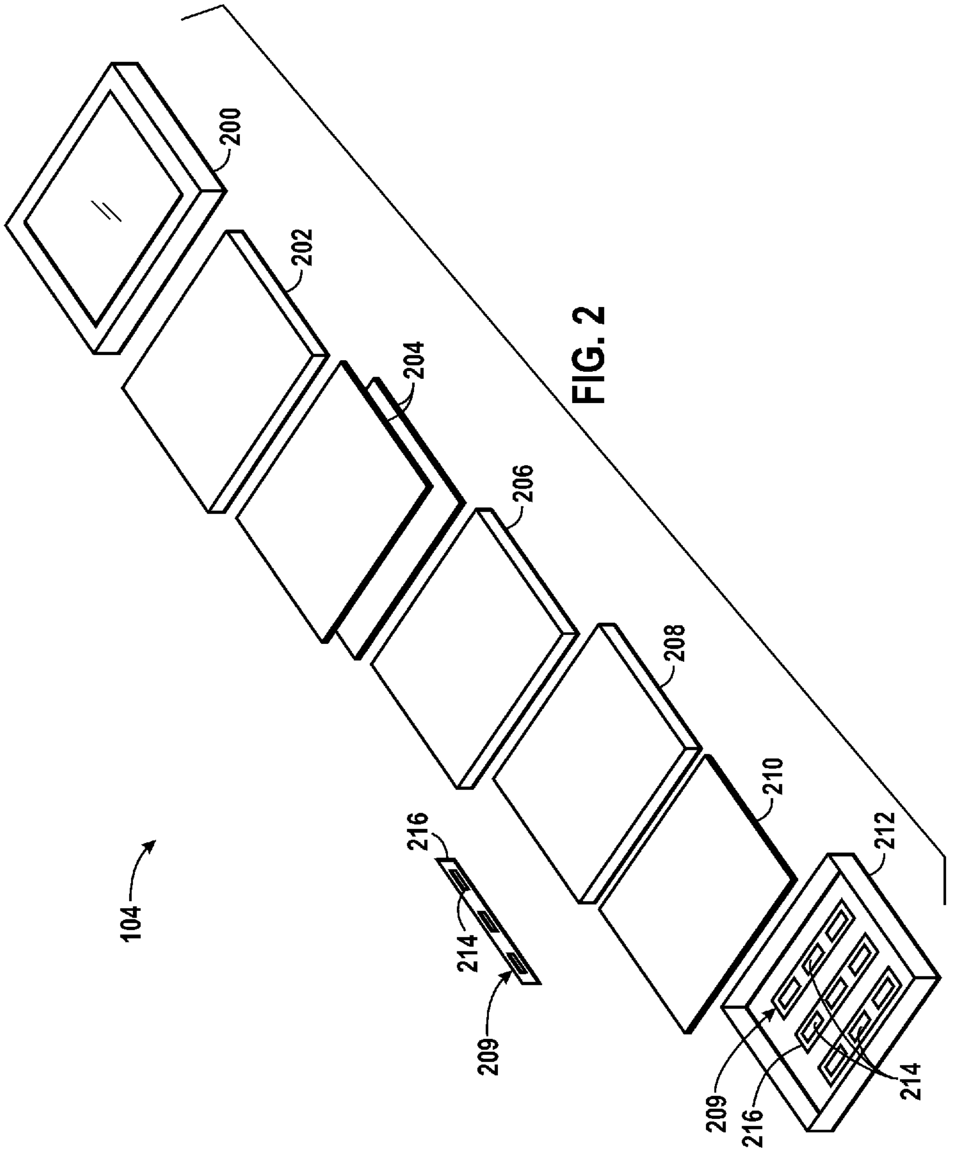
FIG. 2 is an exploded perspective view of a LCD screen in accordance with one embodiment of the present invention.

Additional details of the display 104 may be better understood through reference to FIG. 2, which is an exploded perspective view of one example of the LCD type display 104. The display 104 includes a top cover 200. The top cover 200 may be formed from plastic, metal, composite materials, or other suitable materials, or any combination thereof. In one embodiment, the top cover 200 is a bezel. The top cover 200 may also be formed in such a way as combine with the bottom cover 212 to provide a support structure for the remaining elements illustrated in FIG. 2. A liquid crystal display (LCD) panel 202 is also illustrated. The LCD panel 202 may be disposed below the top cover 200. The LCD panel 202 may be used to display an image through the use of a liquid crystal substance typically disposed between two substrates. For example, a voltage may be applied to electrodes, residing either on or in the substrates, creating an electric field across the liquid crystals. The liquid crystals change in alignment in response to the electric field, thus modifying the amount of light which may be transmitted through the liquid crystal substance and viewed at a specified pixel. In such a manner, and through the use of various color filters to create colored sub-pixels, color images may be represented on across individual pixels of the display 104 in a pixelated manner.

The LCD panel 202 may be made up of a plurality of individually addressable pixels. In one embodiment, LCD panel 202 may include a million pixels, divided into pixel lines each including one thousand pixels. The LCD panel 202 may also include a passive or an active display matrix or grid used to control the electric field associated with each individual pixel. In one embodiment, the LCD panel 202 may comprise an active matrix utilizing thin film transistors disposed along pixel intersections of a grid. Through gating actions of the thin film transistors, luminance of the pixels of the LCD panel 202 may be controlled. In a second embodiment, the LCD panel 202 may comprise a passive matrix. The passive matrix may utilize a grid of conductors. The pixels of the LCD panel 202 may then be disposed along intersections of the matrix. Control of the pixels is achieved by selectively managing the current driven across conductors disposed along the grid. In this manner, in response to the electric field generated by either active or passive matrix, the LCD panel 202 modifies the amount of light which may be transmitted and viewed.

The display 104 also may include optical sheets 204. The optical sheets 204 may be disposed below the LCD panel 202 and may condense the light passing to the LCD panel 202. In one embodiment, the optical sheets 204 may be prism sheets which may act to angularly shape light passing through to the LCD panel 202. In another embodiment, optical sheets 204 may include either one sheet or a plurality of sheets. The display 104 may further include a diffuser plate 206. The diffuser plate 206 may be disposed below the LCD panel 202 and may also be disposed either above or below the optical sheets 204. The diffuser plate 206 may diffuse the light being passed to the LCD panel 202. The diffuser plate 206 may also reduce glaring and non-uniform illumination on the LCD panel 202. A guide plate 208 may also assist in reducing non-uniform illumination on the LCD panel 202. In one embodiment, the guide plate 208 is part of an edge type backlight assembly. In an edge type backlight assembly, a light source 209 may be disposed on the side of the guide plate 208. The guide plate 208 may act to channel the light emanating from the light source 209 upwards towards the LCD panel 202.

The display 104 also may include a reflective plate 210. The reflective plate 210 is generally disposed below the guide plate 208. The reflective plate 210 acts to reflect light that has passed downwards through the guide plate 208 back towards the LCD panel 202. The bottom cover 212 may also be included in the display 104. The bottom cover 212 may be formed in such a way as to combine with the top cover 200 to provide a support structure for the remaining elements illustrated in FIG. 2. The bottom cover 212 may also be used in a direct type backlight assembly, whereby a plurality of light sources are located in the bottom cover. In this configuration, instead of using the light source 209 positioned adjacent the diffuser plate 206 and/or guide plate 208, a plurality of light sources (not shown) may emit light directly towards the LCD panel 202.

The light source 209 may include light emitting diodes (LEDs) 214. LEDs 214 may be a combination of red, blue, and green LEDs 214, or the LEDs 214 may be white LEDs 214. In one embodiment, the LEDs 214 may be arranged on a printed circuit board (PCB) 216 adjacent to the guide plate 208 as part of an edge type backlight assembly. In another embodiment, the LEDs 214 may be arranged on one or more PCBs 216 along the inside surface of bottom cover 212. As illustrated, the LEDs 214 may be arranged in three groupings, each including six LEDs 214 therein. The groupings may be placed in an end to end or in a side by side manner.

The light source 209 may include circuitry required to translate an input voltage into a LED voltage usable to power the LEDs 214 of the light source 209. Since the light source 209 may be used in a portable device, it is desirable to use as little power as possible to increase the battery life of the electronic device 100. To conserve power, the light source 209 may be toggled on and off. In this manner, power in the system may be conserved because the light source 209 need not be powered continuously. This toggling will appear to create constant images to a viewer if the frequency of toggling is kept above at least the flicker-fusion frequency of the human eye, about 30 Hz.

In addition to conserving power, by adjusting the duty cycle (the ratio of light source 209 on to off time) of the toggled light source 209, the overall brightness of the LCD panel 202 may be controlled. For example, a duty cycle of 50% would result in an image being displayed at roughly half the brightness of constant backlight illumination. In another example, a duty cycle of 20% results in an image being displayed at roughly 20% of the brightness that constant backlight illumination would provide. Thus, by adjusting the duty cycle of a toggled signal, the brightness of a displayed image may be adjusted with the added benefit of reducing the power consumed in the electronic device 100.

Figure 3:
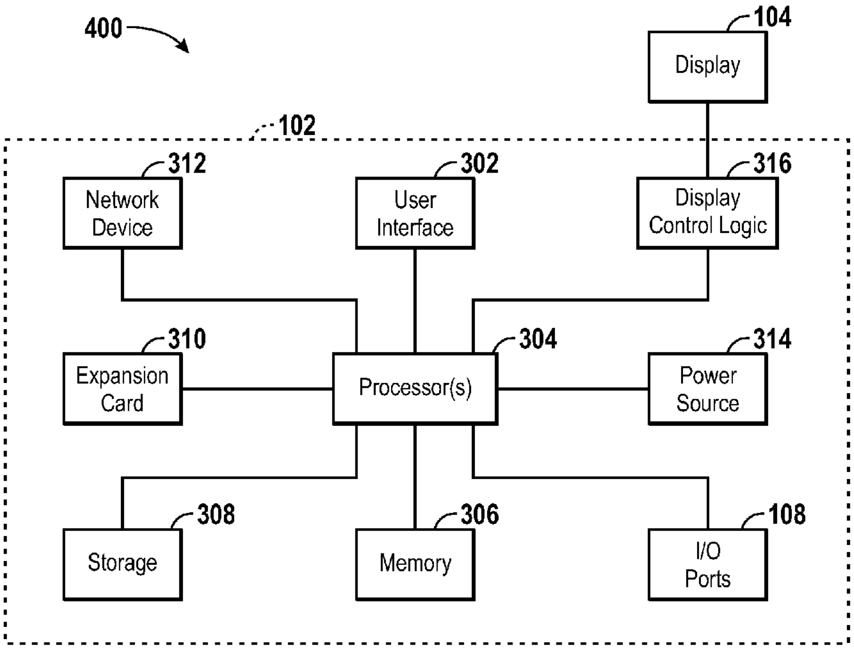
FIG. 3 is a simplified block diagram illustrating components of an electronic device in accordance with one embodiment of the present invention.

Internal components of electronic device 100 are required to accomplish the toggling of the LCD panel 202. FIG. 3 is a block diagram illustrating the components that may be used for the toggling described above. Those of ordinary skill in the art will appreciate that the various functional blocks shown in FIG. 3 may comprise hardware elements (including circuitry), software elements (including computer code stored on a machine-readable medium) or a combination of both hardware and software elements. It should further be noted that FIG. 3 is merely one example of a particular implementation, other examples could include components used in Apple products such as an iPod, an iMac, a MacBook, a MacBook Pro, or an iPhone.

In the presently illustrated embodiment, the components may include the display 104 and the I/O ports 108 discussed above. In addition, as discussed in greater detail below, the components may include a user interface 302, one or more processors 304, a memory device 306, a non-volatile storage 308, expansion card(s) 310, a networking device 312, a power source 314, and display control logic 316. Elements 108 and 302-316 may be disposed inside of enclosure 102, which may be coupled to display 104.

As discussed further herein, the user interface 302 may include a graphical user interface to be displayed on the display 104. The user interface 302 may also provide a means, such as the input structures 106, for a user to input commands and/or data to the electronic device 100. Indeed, the user interface 302 may be a textual user interface, a graphical user interface (GUI), or any combination thereof, and may include various layers, windows, screens, templates, elements, or other components that may be displayed in all or in part of the display 104. The user interface 302 may, in certain embodiments, allow a user to interface with displayed interface elements via one or more input structures 106, either separate from the display 104 or through a touch screen with a GUI. Thus, the user can operate the electronic device 100 by appropriate interaction with the user interface 302. For example, a user may click a button on a mouse to select a control or a link on as part of the user interface 302. A user may also be able to tap a touch screen to select the same control or link. Similarly, a user may drag a mouse or flick a tap screen to scroll or pan through a user interface 302.

The processor(s) 304 may provide the processing capability to execute the operating system, programs, user interface 302, and any other functions of the electronic device 100. The processor(s) 304 may include one or more microprocessors, such as one or more "general-purpose" microprocessors, one or more special-purpose microprocessors and/or ASICS, or some combination thereof. For example, the processor 304 may include one or more instruction processors, as well as graphics processors, video processors, and/or related chip sets.

As noted above, the components may also include a memory 306. The memory 306 may include a volatile memory, such as random access memory (RAM), and/or a non-volatile memory, such as read-only memory (ROM). The memory 306 may store a variety of information and may be used for various purposes. For example, the memory 306 may store the firmware for the electronic device 100, such as an operating system, other programs that enable various functions of the electronic device 100, user interface functions, processor functions, and may be used for buffering or caching during operation of the electronic device 100.

The components may further include the non-volatile storage 308. The non-volatile storage 308 may include ROM, flash memory, a hard drive, or any other suitable optical, magnetic, or solid-state storage medium, or a combination thereof. The non-volatile storage 308 may be used to store data files such as media (e.g., music and video files), software (e.g., for implementing functions on electronic device 100), wireless connection information (e.g., information that may enable the electronic device 100 to establish a wireless connection, such as a telephone connection), and any other suitable data.

The embodiment illustrated in FIG. 3 may also include one or more card slots. The card slots may be configured to receive an expansion card 310 that may be used to add functionality to the electronic device 100, such as additional memory, I/O functionality, or networking capability. Such an expansion card 310 may connect to the device through any type of suitable connector, and may be accessed internally or external to the enclosure 102. For example, in one embodiment, the expansion card 310 may be flash memory card, such as a SecureDigital (SD) card, mini- or microSD, CompactFlash card, Multimedia card (MMC), or the like.

The components depicted in FIG. 3 also include a network device 312, such as a network controller or a network interface card (NIC). In one embodiment, the network device 312 may be a wireless NIC providing wireless connectivity over any 802.11 standard or any other suitable wireless networking standard. The network device 312 may allow the electronic device 100 to communicate over a network, such as a Local Area Network (LAN), Wide Area Network (WAN), or the Internet. Further, the electronic device 100 may connect to and send or receive data with any device on the network, such as portable electronic devices, personal computers, printers, and so forth. Alternatively, in some embodiments, the electronic device 100 may not include a network device 312. In such an embodiment, a NIC may be added into card slot 310 to provide similar networking capability as described above.

Further, the components may also include a power source 314. In one embodiment, the power source 314 may be one or more batteries, such as a lithium-ion polymer battery. The battery may be user-removable or may be secured to the housing 102, and may be rechargeable. Additionally, the power source 314 may include AC power, such as provided by an electrical outlet, and the electronic device 100 may be connected to the power source 314 via a power adapter. This power adapter may also be used to recharge the one or more batteries.

The internal components may further include display control logic 316. The display control logic 316 may be coupled to the display 104. The display control logic 316 may be used to control light source 209. In one embodiment, the display control logic 316 may act to toggle light source 209 on and off. This toggling may be used to decrease the overall brightness of the display 104 when the power source, such as a battery is being used. When the power source 314 is an AC power source, the overall brightness of the display 104 may be modified simply by raising and/or lowering the constant voltage level supplied to the light source 209. However, when the electronic device 100 is operating off of a DC power source 314, such as a battery, toggling of the light source 209 may be utilized to conserve power, as described above. This toggling immediately reduces the brightness of the display 104 because the light source 209 is not continuously active. Control of the amount of brightness can be adjusted through changing the duty cycle of the toggled light source 209. For instance, if the duty cycle was 0%, then the light source would never be on and the display 104 would be dark. Conversely, if the duty cycle was 100%, then the screen would be at full brightness because the light source 209 would always be active (however, as much power would be used as was used in the AC power source 314 example above). A duty cycle of 50% would lead to half the brightness of the display 104 being always on, but would reduce power consumption by as much as 50%.

The display control logic 316 may be used to automatically set the brightness of the display 104 when the DC power source 314 is activated. For example, if the electronic device is running from the AC power source 314, and then is unplugged to run on a battery (DC power source 314), then the display control logic 316 may automatically toggle the light source on and off at a duty cycle of 50%. As the electronic device 100 continues to be powered by a DC power source 314, the display control logic 316 may be used to automatically set the brightness of the display 104 in response to a predetermined condition, such as when the DC power source 314 falls below a certain threshold. For example, if the battery in the electronic device 100 is halfway depleted, the digital control logic 316 may change the duty cycle of the toggled light source 209 from the default level of 50% to 33%. This reduction in duty cycle uses less power because the light source is powered on only one third of the time relative to an AC power source 314 being utilized, resulting in the consumption of roughly one third the power consumed relative to the power used when the light source 209 is always active. In a further embodiment, the digital control logic 316 may be used to decrease the brightness of the display 104 in response to user input, regardless of the power source 314 employed.

Figure 4:
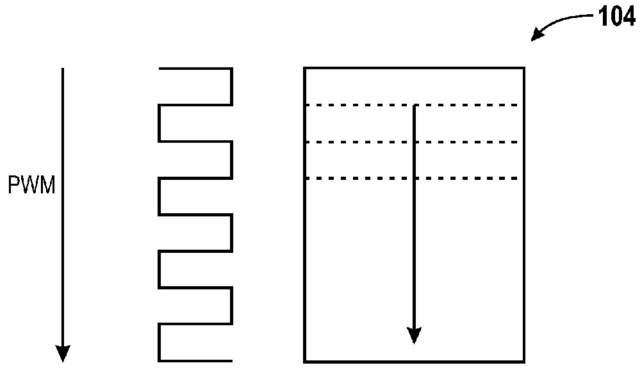
FIG. 4 depicts a pulse width modulation process in combination with one embodiment of a frame refresh process.

The display control logic 316 may include circuitry to refresh the pixels of the display 104. This process of refreshing executed by display control logic 316 is illustrated in FIG. 4, which shows a frame refresh process in combination with a PWM signal. As discussed above, the LCD panel 202 may include a passive or an active display matrix or grid used to control the electric field associated with each individual pixel. Over time, the voltages applied to each liquid-crystal pixel may begin to deteriorate. To correct this deterioration, a refresh operation may be used to recharge the electric field to its proper potential. This refresh operation is typically accomplished one line of pixels at a time, from the top of the display 104 to the bottom. In one embodiment, there are approximately one thousand pixel lines in the display 104 to be refreshed per frame refresh operation. Each pixel line may contain 1000 pixels which need to be refreshed. The frame rate (refresh rate per second for an entire display) must be kept above the flicker-fusion frequency of the human eye, about 30 Hz. If the frame rate falls below flicker-fusion frequency of the human eye, the display 104 will cease to display images that appear to be steady to a human. The frame rate for the display 104 may be set at 60 Hz.

The display control logic 316 may further include a pulse-width modulator (PWM) used to generate a PWM signal. The PWM signal may be an oscillating signal used to toggle the light source 209 on and off. As illustrated in FIG. 4, the PWM may transmit an oscillating PWM signal during each frame refresh cycle. In the example illustrated in FIG. 4, the PWM toggles the backlight light source 209 on and off exactly four times per frame while the duty cycle for the PWM signal is at 50%. However, it should be noted that the duty cycle of the PWM signal is selectable and may vary anywhere from 0-100%. As described previously, the duty cycle (the ratio of light source 209 on to off time) of the PWM signal determines the overall brightness of the display 104. However, while the brightness of display 104 may be controlled by changing the duty cycle of the PWM signal, the use of a PWM signal in this manner may create a problem. In FIG. 4, the PWM signal oscillates exactly four times per frame with a 50% duty cycle. This can create the situation in which certain pixel lines are always refreshed while the backlight light source 209 is activated, while others are always refreshed while the backlight light source 209 is deactivated. For example, in FIG. 4, pixel lines 1-125, 251-375, 501-625, and 751-875 will always be refreshed while backlight light source 209 is activated, whereas pixel lines 126-250, 376-500, 626-750, 876-1000 will always be refreshed while the backlight light source 209 is deactivated. This may lead to visible light and dark bands, wherein the pixel lines refreshed when the backlight light source 209 is active are noticeably brighter than the pixel lines refreshed while the light source 209 is non-active.

Figure 5:
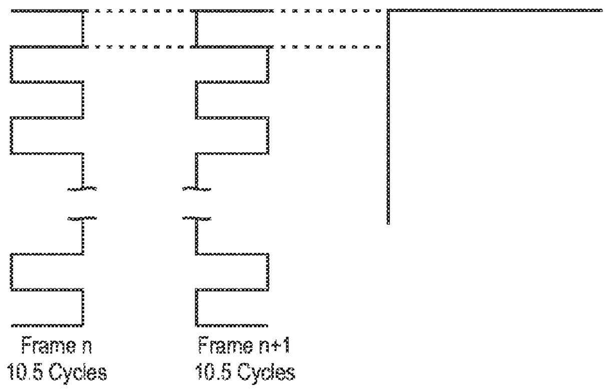
FIG. 5 depicts an anti-phased pulse wave modulation signal across two contiguous frame refresh periods.

A pictorial solution to the banding problem discussed above is illustrated in FIG. 5, which depicts an anti-phased PWM signal across two contiguous frame refresh periods. As illustrated, during frame n, there are 10.5 cycles. Similarly, during frame n+1, there are 10.5 cycles. The extra half cycle during each frame creates an anti-phased PWM signal across two contiguous frames. In this manner, the effects of banding are eliminated because the anti-phased nature of the PWM signal ensures that all pixel lines are equally exposed to the same amount of backlight over two consecutive frames. In effect, no pixel line receives more backlight illumination than another pixel line. To insure that the PWM signal is properly anti-phased, the PWM signal must correspond to the frame refresh rate at a fractional multiple of a refresh rate of the display. In the example above, the PWM signal cycled 10.5 times per frame refresh. If the frame refresh rate remains unchanged, the PWM signal will be properly anti-phased. If, however, the frame refresh rate drifts slightly to a new rate, and the PWM signal does not drift by a corresponding amount, then the PWM signal will no longer cycle 10.5 times per frame refresh, but at a value slightly less or more than 10.5 cycles per frame. This can create a rolling shimmer effect visible to the human eye. Thus, to eliminate the possibility of a shimmer effect due to a drifting frame refresh rate, the frequency of the PWM signal may be related to the refresh rate. In this manner, the PWM signal may drift with the frame refresh rate so that the PWM signal will be continuously anti-phased with the frame refresh rate, regardless of changes in that frame refresh rate.

Mathematically, the relation of the frequency of the PWM signal to the frame refresh rate may be explained as follows. Let the frame rate, $F^r$, equal the number of frames of the display 104 that are refreshed per second. Let the duty cycle, d, be expressed as a positive real number between 0 and 1 inclusively. The duty cycle will determine the amount of time that the light source 209 is on and off for a given PWM signal pulse. Further, let m, be the base integer non-zero PWM signal frequency multiplier of the frame rate $F_r$. A PWM signal frequency multiplier m is required to insure that the PWM signal frequency is greater than 100 Hz but less than 1 kHz, since frequencies below 100 Hz this may be visibly noticeable as flicker and frequencies above 1 kHz may cause electromagnetic interference. For a specified m and a specified d ranging from 0 to 0.5, the equation for the anti-phased PWM signal frequency, $F_{pwm}$, is:

$$F_{pwm}=(m+d)*F_r$$

Similarly, for a specified m and a specified d ranging from 0.51 to 1.00, the equation the for the anti-phased PWM signal frequency, $F_{pwm}$, is:

$$F_{pwm}=(m+1-d)*F_r$$

These equations reflect the symmetry of the relationships between the PWM signal frequency rate and the duty cycle. Thus, for an m value of 10, a d value of 0.333, and a $F_r$ value of 60 Hz, the PWM signal frequency would be 620 Hz. Similarly, for an m value of 10, a d value of 0.667, and a $F_r$ value of 60 Hz, the PWM signal frequency would also be 620 Hz. This exemplifies the proposition that both a PWM signal with a duty cycle of 33% and a PWM signal with a duty cycle of 67% need three consecutive refresh frames to ensure an anti-phased PWM signal equally exposes all pixel lines to the same amount of backlight. In one embodiment, a PWM signal with a frequency of 630 Hz combined with a duty cycle of 50% creates an anti-phased PWM signal over any two consecutive frames. In another embodiment, a PWM signal with a frequency of 620 Hz combined with a duty cycle of 33% would create an anti-phased PWM signal over any three consecutive frames.

Figure 6:
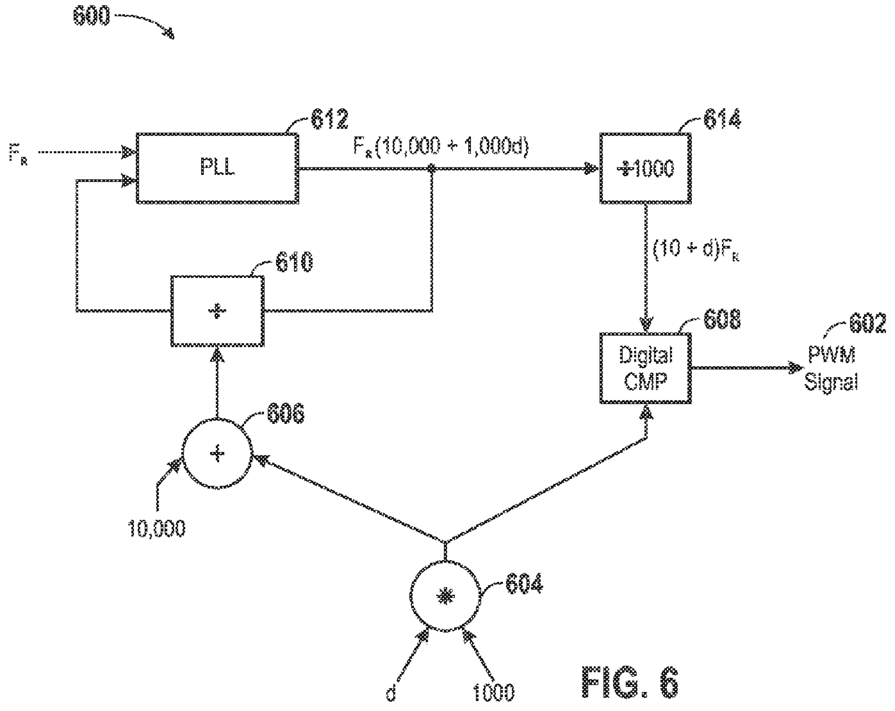
FIG. 6 is a simplified block diagram of a pulse width modulator in accordance with one embodiment of the present invention.

Implementation of the equations described above may be carried out using hardware or software. For example, the display control logic 316 may include hardware capable of generating an anti-phased PWM signal in the manner outlined above. FIG. 6 is a simplified block diagram of one embodiment of hardware capable of generating an anti-phased PWM signal. FIG. 6 illustrates a pulse width modulator (PWM) 600, which may be implemented in the display control logic 316. The illustrated PWM 600 is capable of changing the frequency of the PWM signal 602 in one tenth of one percent increments. The adjustment of the resolution of the PWM signal 602 to a tenth of a percent is accomplished by constructing the PWM 600 with one thousand as the granularity multiplier. The PWM may be constructed for less PWM signal 602 resolution. For example, by setting the granularity multiplier to 100, the resolution of the PWM signal 602 may be adjusted in one percent increments. The implementation of the granularity multiplier will be discussed further below.

The illustrated PWM 600 includes a multiplication circuit 604. Multiplication circuit 604 may multiply the d value selected by the granularity multiplier, here one thousand. The d value is selected by the user, for example, by a user changing the brightness setting of a display by pressing input structures 106 such as function keys on a keyboard. In another embodiment, as described above, the display control logic 316 may be used to automatically set d to adjust the brightness of the display 104 when the DC power source 314, such as when the electronic device 100 is unplugged from a power source and must run off battery power.

The result of the multiplication circuit 604 is transmitted to an addition circuit 606 and a digital comparator 608. The addition circuit 606 has as a second input, the PWM signal frequency multiplier m times the granularity multiplier, here a value of ten for m and a value of one thousand for the granularity multiplier or ten thousand. In this manner, it can be seen that the circuitry of PWM 600 is adding m and d (with a granularity multiplier factor) as part of the anti-phased PWM signal frequency equation $F_{pwm}=(m+d)*F_r$. The result of the addition circuit 606 may be passed to a feedback divider 610 used in conjunction with phase locked loop 612.

Phase locked loop 612 operates to generates a signal that has a fixed relation to the phase of the input signal, here the frame rate $F_r$. Thus, the output signal of the phase locked loop 612 will always be related to the input frequency $F_r$. The feedback divider 610 may be used to generate an output signal frequency at an integer multiple of the input signal. By utilizing a phase locked loop 612 with d and m as part of the integer multiplier, the PWM signal 602 will remain in phase with the frame rate $F_r$, regardless of any lag of input frame rate $F_r$ signal.

As illustrated in the PWM 600, feedback divider 610 is used to generate an output frequency equal to the frame rate $F_r$*(m+d) (as modified by the granularity multiplier factor of 1000). The output value of the phase locked loop 612 is then transmitted to a divider circuit 614. The divider circuit 614 may be a counter based on granularity multiplier. In the illustrated embodiment, the divider circuit 614 is a divide by one thousand (the granularity multiplier) counter. Thus, the divider circuit 614 produces an output of 0, 1, 2 . . . 999, wherein each output corresponds to a pulse of the signal coming from the phase locked loop 612. In effect, the result is a repeating count from 0 to 999 at a rate of 630 Hz, which is sent to the digital comparator 608.

The digital comparator 608 may compare the result of the multiplication circuit 604 (the product of d value and the granularity multiplier) with the series transmitted from the divider circuit 614. When the value from the multiplication circuit 604 is greater than the value in the series transmitted from the divider circuit 614, the digital comparator 608 may output a digital high, or one, signal. When the value from the multiplication circuit 604 is less than or equal to the value in the series transmitted from the divider circuit 614, the digital comparator 608 may output a digital low, or zero, signal. For example, if the value transmitted from the multiplication circuit 604 is equal to five hundred, then the digital comparator 608 will output an active low signal. This process will repeat as the divider circuit rolls over 999 and back to 0. In this manner, the digital comparator 608 creates a PWM signal 602 with an correct duty cycle (as determined by d) and at a synchronized and tunable multiple of the frequency of the frame rate $F_r$. Accordingly, an oscillating PWM signal 602 is generated, which eliminates banding, ensures all pixels in the display 104 receive equal exposure to the backlight illumination, may be synchronized to the refresh rate of the display, and may control the brightness of the display 104.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An electronic device, comprising:
a display comprising a plurality of pixels;
a light source adapted to generate light to illuminate the plurality of pixels; and
display control logic adapted toggle the light source on and off at a frequency determined to equally expose the plurality of pixels to an equal amount of light over a plurality of contiguous frames, wherein the frequency is generated based on a comparison of a modified refresh rate of the display with a modified duty cycle value.

2. The electronic device of claim 1, wherein the frequency is adjusted in response to user initiated changes to the display brightness.

3. A pulse width modulator adapted to generate an oscillating anti phased pulse width modulator signal at a non-integer multiple of a refresh rate of a display, wherein the oscillating anti-phased pulse width modulator signal is generated based on a comparison of a modified refresh rate of the display with a modified duty cycle value.

4. The pulse width modulator of claim 3, wherein the oscillating anti-phased pulse width modulator signal toggles a light source on and off.

5. The pulse width modulator of claim 3, wherein the display brightness is controlled by adjusting a duty cycle of the oscillating anti-phased pulse width modulator signal.

6. The pulse width modulator of claim 5, wherein the duty cycle is selected based on user input.

7. The pulse width modulator of claim 5, wherein the duty cycle is selected based on the amount of internal power remaining in an internal power source which powers the pulse width modulator.

8. An electronic device, comprising:
a display having a light source; and
display control logic adapted to control the display brightness by toggling the light source on and off at a fractional multiple of a refresh rate of the display, wherein toggling the light source on and off at a fractional multiple of a refresh rate of the display comprises issuing an oscillating signal from a pulse width modulator at a non-integer multiple of the refresh rate of the display, wherein the oscillating signal is generated based on a comparison of a modified refresh rate of the display with a modified duty cycle value.

9. The electronic device of claim 8, wherein toggling the light source on and off further comprises adjusting a duty cycle of the oscillating signal from a pulse width modulator.

10. The electronic device of claim 9, wherein the duty cycle is selected based on user input.

11. The electronic device of claim 9, wherein the duty cycle is selected based on the amount of internal power remaining in an internal power source which powers the pulse width modulator.

12. The electronic device of claim 8, wherein the display comprises a backlight assembly adapted to diffuse and direct light from the light source to a liquid crystal display panel in the display.

13. A method of providing equal illumination to all pixels in a display, comprising generating via a pulse width modulator an oscillating anti-phased pulse width modulator signal at a non-integer multiple of a refresh rate of a display, wherein the oscillating anti-phased pulse width modulator signal is generated based on a comparison of a modified refresh rate of the display with a modified duty cycle value.

14. The method of claim 13, comprising toggling a light source on and off based on the oscillating anti-phased pulse width modulator signal.

15. The method of claim 13, comprising controlling the display brightness by adjusting a duty cycle of the anti-phased pulse width modulator signal.

16. The method of claim 15, comprising selecting the duty cycle based on user input.

17. The method of claim 15, comprising selecting the duty cycle based on the amount of internal power remaining in an internal power source which powers the pulse width modulator.

18. A method for illuminating a display, comprising:
generating light from a light source;
directing the light towards a plurality of pixels; and
toggling the light source on and off at a frequency determined to equally expose the plurality of pixels to an equal amount of light over a plurality of contiguous frames, wherein the frequency is generated based on a comparison of a modified refresh rate of the display with a modified duty cycle value.

19. The method of claim 18, comprising adjusting the frequency in response to user initiated changes to the display brightness.

* * * * *